US008748802B2

(12) United States Patent
Allen et al.

(10) Patent No.: US 8,748,802 B2
(45) Date of Patent: Jun. 10, 2014

(54) LASER DRAWN ELECTRONICS

(75) Inventors: Edward H. Allen, Lancaster, CA (US); Markos Karageorgis, Palmdale, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 343 days.

(21) Appl. No.: 13/198,557

(22) Filed: Aug. 4, 2011

(65) Prior Publication Data

US 2013/0032700 A1 Feb. 7, 2013

(51) Int. Cl.
*H01J 3/14* (2006.01)
*H01L 31/00* (2006.01)

(52) U.S. Cl.
USPC .......................................... 250/216; 250/214.1

(58) Field of Classification Search
USPC .................................. 250/204, 205, 239, 216
See application file for complete search history.

(56) References Cited

U.S. PATENT DOCUMENTS

| | | | | |
|---|---|---|---|---|
| 5,543,886 A * | 8/1996 | Suda | ............................ | 396/114 |
| 6,046,631 A * | 4/2000 | Kitahara et al. | .............. | 329/354 |
| 6,998,620 B2 * | 2/2006 | Schriever | ...................... | 250/372 |
| 7,446,451 B2 | 11/2008 | Allen et al. | | |

* cited by examiner

*Primary Examiner* — Kevin Pyo
*Assistant Examiner* — Don Williams
(74) *Attorney, Agent, or Firm* — McDermott Will & Emery LLP

(57) ABSTRACT

Various aspects of the subject technology provide systems and methods for transmitting a radio frequency (RF) signal from a desired location on the surface of a photoconversion material by simply directing a laser beam or other energy beam to the desired location on the photoconversion material. In one aspect, the laser beam causes electrons in the photoconversion material to accelerate and emit the RF signal by forming a dead region on the photoconversion material that the electrons must flow around. In one aspect, the dead region has an asymmetrical shape to prevent a cancellation effect and produce a net positive RF signal. Various aspects of the subject technology also provide systems and methods for drawing a circuit element on the photoconversion material by tracing one or more dead regions on the photoconversion material with a laser beam or other energy beam to construct the circuit element.

20 Claims, 5 Drawing Sheets

LASER DRAWN ELECTRONICS

STATEMENT REGARDING FEDERALLY SPONSORED RESEARCH OR DEVELOPMENT

Not applicable.

FIELD

The present invention generally relates to electronics, and more particularly to laser drawn electronics.

BACKGROUND

A photoconversion material may be used to convert incoming photonic energy into electrical energy. Examples of photoconversion materials include solar cells, Stark cells and thermophotovoltaic cells. A Stark cell can be modeled as a photodiode in sheet form (a large expanse of photodiode junctions merged into one) that behaves like a solar cell except that it operates at lower frequencies and thus may be configured to convert "earthshine" rather than sunshine into electrical energy. Earthshine is radiated from the earth at a mean wavelength of 10.5 microns (compared to sunshine at ~0.5 micron). A photoconversion material may comprise a photo-sensitive bulk semiconductor and/or a metamaterial (man-made, non-natural materials) that may be better matched to the frequencies of the incident light than naturally-occurring materials and thus produce stronger photovoltaic or photocurrent effects. Photoconversion effects of various forms are accessible for all frequencies of incident light (electromagnetic radiation or photons) and all conductor/semi-conductor/insulator materials.

SUMMARY OF THE INVENTION

Photoconversion devices can be arranged into a dense array forming a planar system that absorbs incident radiation and converts it into a sheet of current (electrons) flowing across the surface on one side of the plane along with a countervailing current sheet (holes) flowing on the other side of the plane. The flows are driven by a potential difference between the two current sheet and the flows can be tapped electrically to do work.

The flows of current can be interrupted and diverted within the plane by placing various externally-applied local fields such that eddies of diverse configurations can be established durably or momentarily within the flows. These eddies are equivalent to electronic circuits and be shaped and controlled to behave as any desired circuit. Durable circuit elements can be established by incorporating magnetic or electrostatic elements in the plane. Transitory circuit elements can be established by propinquination of field sources such as electrodes or external magnetic poles. Various aspects of these flow circuits provide systems and methods for generating, a radio frequency (RF) signal from a desired location on the photoconversion material by simply directing a short pulse from laser beam or other energy beam to the desired location on the photoconversion material. In one aspect, the laser beam causes some of the electrons flowing within the current sheet to accelerate and thus emit an RF signal by forming eddies on the photoconversion material that the remaining electrons must flow around. In one aspect, the eddy (also referred to as a dead region) has an asymmetrical shape to prevent a cancellation effect and produce a net positive RF signal.

Various aspects of the subject technology, then, provide systems and methods for drawing a circuit element on the photoconversion material by tracing one or more dead regions on the photoconversion material with laser pulses or other energy pulses to construct the circuit element. The ability to draw circuit elements on the sheet of current of the photoconversion material allows the creation of entire connected circuits incorporating complex functionality without the need to add physical components on the surface of the photoconversion material and allows circuit elements to be quickly modified, tuned, or replaced with new circuit elements. For example, if the region is shaped as an airfoil, the flows on one side of the obstacle must be faster (slower) than those on the other. Useful experimental analogs for the present invention can be created using a Hele-Shaw Apparatus.

For the current to flow, there must be an electromotive force applied in such a way as to cause the flux of electrons to drift in the same direction. An EMF can be established in this device in a number of ways that are well known in the art (for simplicity in the disclosure, it will be assumed that the EMF is established with a battery, capacitor, or other electric field source). Once the sheet of current is flowing, tiny "eddies" can be created in the flow by inserting blockages of various kinds Unlike a three-dimensional system, the fact that a current sheet is confined to two dimensions, means there is strong suppression of downstream wake effects such as those that form in a three dimensional flow (for example, the organized series of counter-rotating vortices, called a "vortex street"). This suppression of wake effects is a well known phenomenon in Hele-Shaw Apparatus. The result is that the obstruction causes the electron current in the neighborhood to flow in a curved trajectory. Curvilinear motion is accelerated motion by definition; the acceleration being transverse to the direction of flow. When electrons are accelerated they emit some energy (i.e., the arithmetic product of their potential and their charge and their rate of change of flow in the form of photons (e.g., RF radiation)). This power radiates away. Since charge is conserved and potential is externally established and thus not affected by the radiation, the generation and departure of a photon can only slow the rate of local flow and, thus, lead to a series of strong interactions among the flowing electrons. It is these interactions, when properly controlled and regulated that provide the circuit element functionality.

In one aspect, a method for generating and transmitting a radio frequency (RF) signal is provided. The method comprises exposing a photoconversion material to an energy source (e.g., sunshine or earthshine) to produce a planar sheet of current flow in the material. The method further comprises directing an energy beam (e.g., a laser beam) to a desired location on the photoconversion material to form a dead region having an asymmetrical shape and thus establishing an asymmetric acceleration of the local current, wherein the dead region causes the RF signal to be radiated from the local region of the photoconversion material.

Additional features and advantages of the invention will be set forth in the description below, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

DETAILED DESCRIPTION

Figure 1:
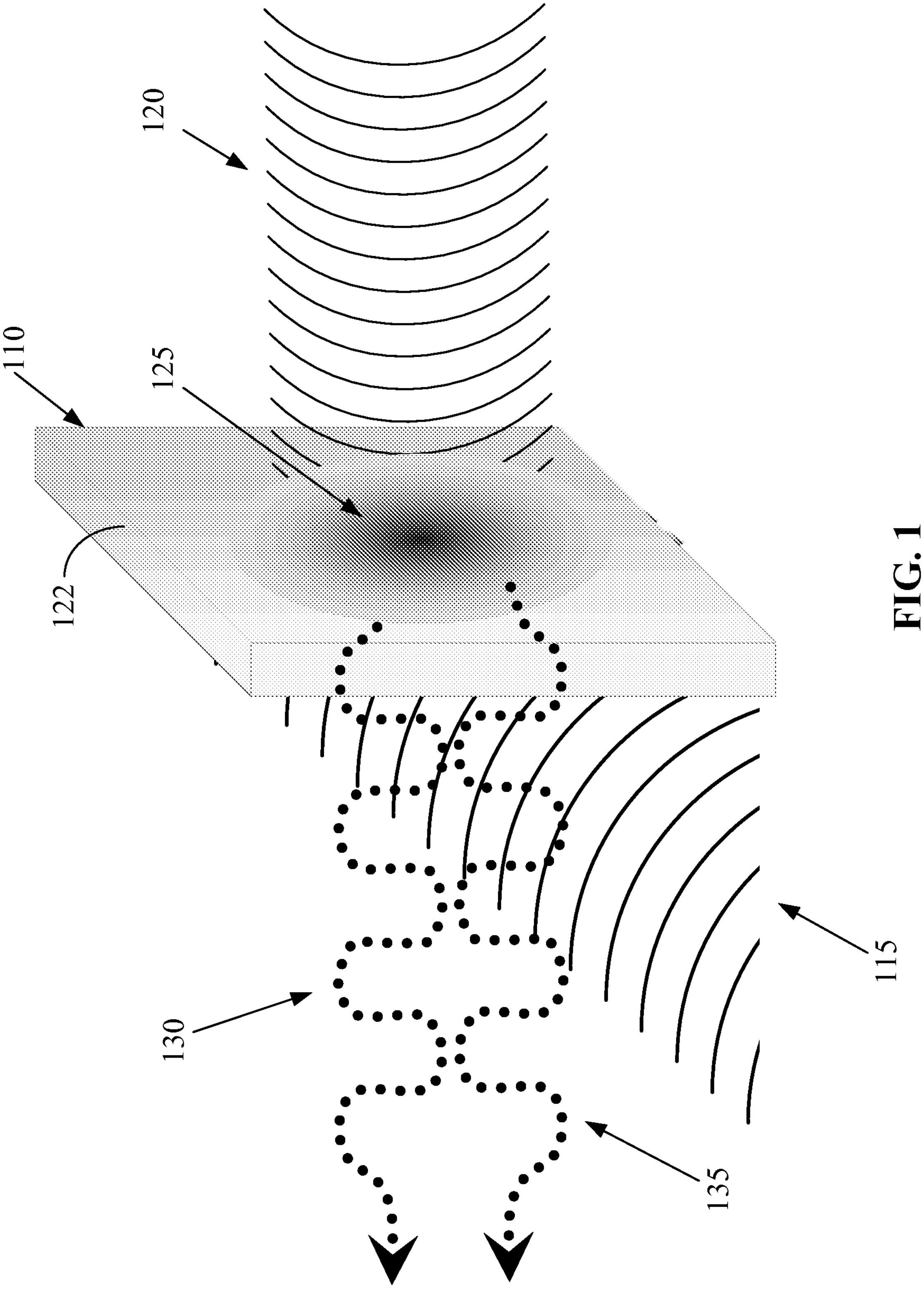
FIG. 1 shows an example of radiating RF signals from a photoconversion material by directing a laser at the photoconversion material according to an aspect of the subject technology.

FIG. 1 shows an example of a photoconversion material 110 that converts incoming photons 115 into electrical energy. The photoconversion material 110 may comprise one or more solar cells, Stark cells, thermophotovoltaic cells or other type of photoconversion material such as a photovoltaic material. A Stark cell can be modeled as a photodiode in sheet form (a large expanse of photodiode junctions merged into one) that behaves like a solar cell except that, because the nanostructure of its metamaterials is configured at a scale to resonate with lower frequency light, it may convert "earthshine" rather than sunshine into electrical energy. Earthshine is radiated from the earth and has a wavelength in the Infrared spectrum (peaking at ~10.5 micron). In one aspect, the Stark cell may be tuned to different wavelengths (e.g., earthshine, sunshine, etc.) to covert photons at the different wavelengths into electrical energy. Additional details on Stark cells can be found, for example, in U.S. Pat. No. 7,446,451, issued on Nov. 4, 2008, the entirety of which is incorporated herein by reference. The photoconversion material 110 may comprise a photo-sensitive bulk semiconductor, quantum dots, nanocrystals, other nanostructures or some combination 122. Quantum dots, nanocrystals, and other nanostructures 122 are very small structures (e.g., on the order of nanometers) that may formed from a variety of different organic or inorganic materials and be may be coated on a substrate.

The photons 115 may come from solar radiation, radiation from the earth ("earthshine"), or other source. In general, the photoconversion material 110 absorbs energy from the photons 115 impinging on it. The absorbed energy excites electrons in the device from the valence band to the conduction band forming electron-hole pairs, which can produce current flow in the photoconversion material. A voltage may be applied across the photoconversion material 110 from an external source (not shown) to generate an electric field to direct the current flow in a desired direction. The current may be drawn off the photoconversion material 110, for example, to drive and/or power an external circuit.

In one aspect, the photoconversion material 110 may be used to radiate microwaves from a desired location on the material 110 by simply directing a laser or other energy beam source at the desired location on the device 110 and modulating the output of the laser at a desired RF frequency. FIG. 1 shows an example of a laser beam 120 that is directed to a location on the photoconversion material 110. In one aspect, the photoconversion material 110 is designed to have absorption resonances at the energy density of the incident radiation 115 being harvesting for the source energy and distinct resonances at the energy density of the laser pulse 120 which typically is much greater than the energy density of the harvested photons 115. For example, the harvested photons 115 may have an energy density of 1.4 $KW/m^2$ for sunlight and 245 $W/m^2$ for earthshine while the laser beam 120 may have a much higher energy density on the order of one $KW/cm^2$ to one $KW/mm^2$ The laser beam 120 resonates with elements of the photoconversion material that enable and promote conduction of the sheet of current and disconnect the nanostructure elements from one another thus creating a dead region 125 where the laser beam 120 is incident on the photoconversion material 110. One embodiment of this feature is to use a Stark split to fill the gap of the semi-conductor and thus short it out, killing its conductivity in the dead region. Other embodiments exist as well. The dead region 125 blocks current flow and forces the current from the rest of the material to flow around the dead spot 125 and thus accelerate. This is because the laser beam 120 modifies the energy state of the photoconversion material 110 within the dead region 125 with a Stark shift rendering the basic photoconversion effect inoperable. The region of inoperable photoconversion creates a potential barrier to electrons flowing in the current sheet, effectively blocking the flow through the dead region 125.

As a result, the current sheet must flow around the dead region 125, forming eddies. Because the eddies are curved, they comprise accelerated electron paths. Accelerated electrons radiate RF signals 130 and 135. The energy lost in radiating the RF signals is restored by energy from the incident radiation 115. The energy from the laser is not absorbed (or is only weakly absorbed) because it is detuned with respect to the photoconversion phenomenon. So while the laser is higher in energy density than energy from incident radiation it is nonetheless a much smaller quantity of energy and only serves to establish the applied field that momentarily deflects the current flow creating the accelerations that enable radiation. Thus, the laser beam 120 may be used to controllably radiate RF signals 130 and 135 from a desired location on the photoconversion material by directing the laser beam 120 to the desired location.

Figure 2:
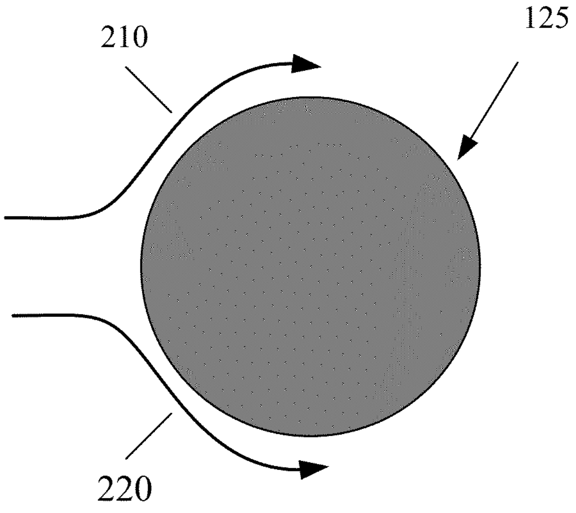
FIG. 2 shows an example of a symmetrical dead region formed on the photoconversion material by a laser according to an aspect of the subject technology.

However, when the dead region 125 is symmetric (as shown in the example in FIG. 1), the dead region may cause the electrons flowing around the dead region to generate RF signals 130 and 135 having the same frequency, but opposite phases, effectively cancelling both emissions. An example of this is shown in FIG. 2, which shows a top view of the dead region 125. In this example, the dead region is a symmetric circle, which causes current 210 on one side of the dead region 125 to flow around the dead region 125 in a clockwise direction and current 220 on the other side of the dead region to flow around the dead region 125 in a counterclockwise direction. The current 210 flowing in the clockwise direction radiates an RF signal 130 with the opposite phase of the RF signal 135 radiated by the current 220 flowing in the counterclockwise direction. As a result, the RF signals 130 and 135 shown in FIG. 1 effectively cancel each other.

This cancellation effect can be prevented by making the dead region 125 asymmetrical in shape so that the current path is more curved, and hence more accelerated, going around the dead region in the clockwise direction than the counterclockwise direction or vise versa. The more curved the path, the greater the electron acceleration, and the greater the amount of radiation generated. As a result, the radiation emitted from the more curved path is greater than the canceling radiation emitted from the less curved path, resulting in a net positive radiance. In this way, the radiation at a desired phase can be made to dominate the radiation at the opposite phase so that the superposition of the two results in a net positive radiation at the desired phase.

Figure 3:
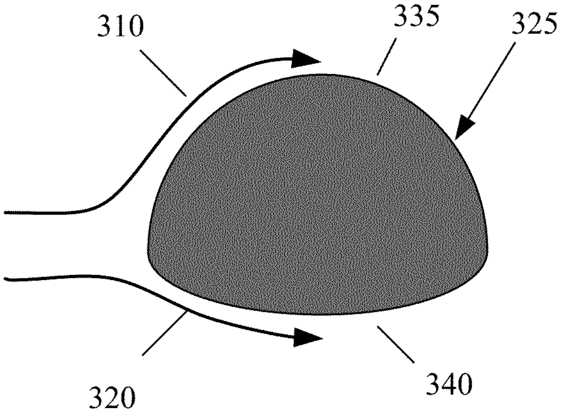
FIG. 3 shows an example of an asymmetrical dead region formed on the photoconversion material by a laser to prevent a cancellation effect according to an aspect of the subject technology.

An example of net positive radiation is shown in FIG. 3, which shows a top view of an asymmetrical dead region 325 having one side 335 that is more curved than the other side 340. The more curved side 335 of the dead region 325 causes the current 310 flowing around this side 335 to flow in a more curved path, resulting in more acceleration and more radiation generation than the current 320 flowing around the less curved side 340. This results in a positive net radiation.

Figure 4:
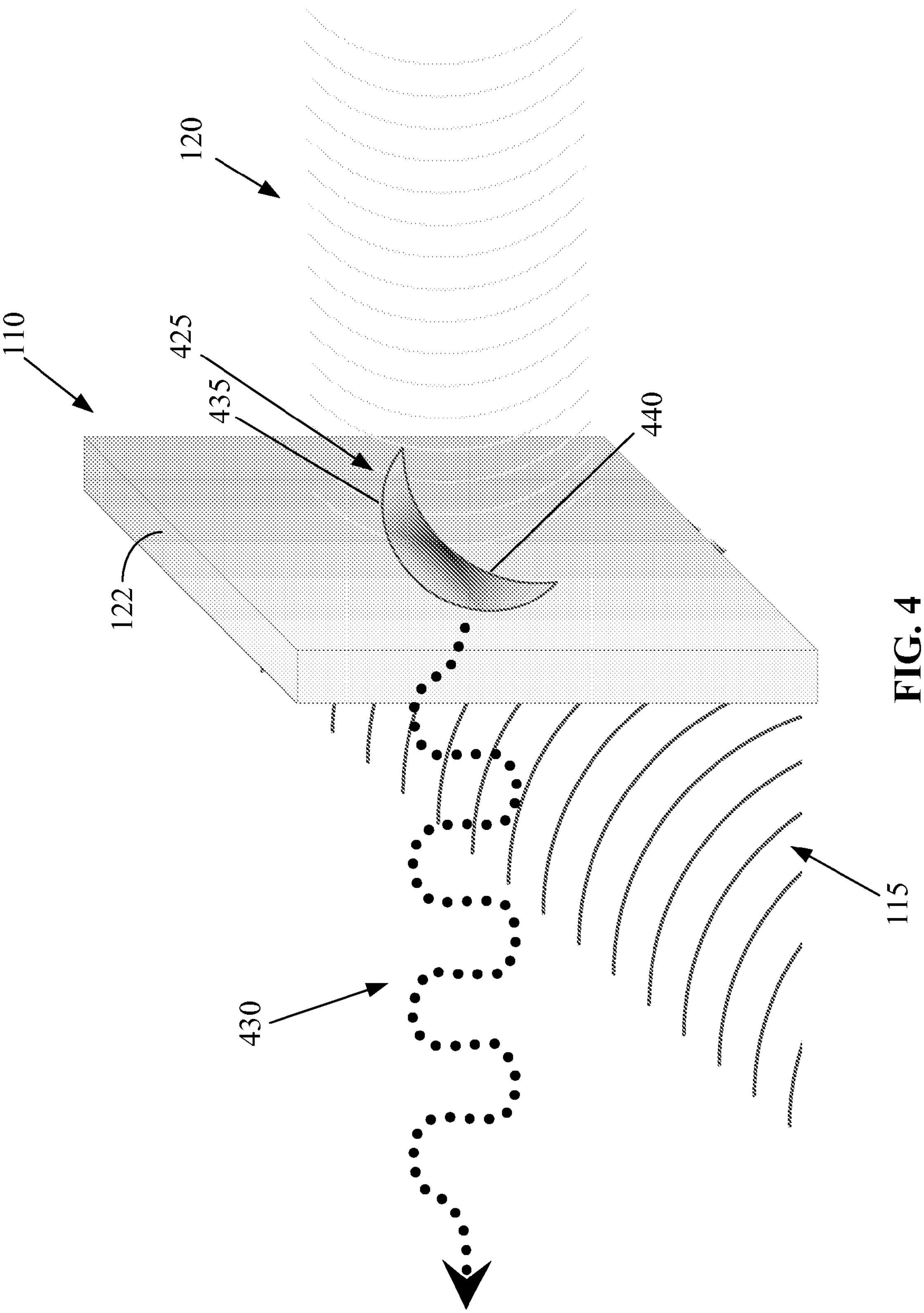
FIG. 4 shows an example of radiating a net positive RF signal from a photoconversion material by directing a laser at the photoconversion material to form an asymmetrical dead region according to an aspect of the subject technology.

FIG. 4 shows an example, in which the laser beam 120 produces a dead region 425 on the photoconversion material 110 having a crescent shape, in which one side 435 of the dead region 425 is more curved than the other side 440. The more curved side 435 of the dead region 425 causes the current flowing around this side 435 to flow in a more curved path, resulting in more acceleration and more radiation generation than the current flowing around the less curved side 440. This results in a net positive RF signal 430 being emitted.

A desired asymmetrical shape for the dead region may be created by shaping the laser beam or other energy beam incident on the photoconversion material 110 using an optical system (e.g., optical lenses, mirrors, beam splitters and/or any combination thereof) between the source of the laser beam or other energy beam and the photoconversion material. In another aspect, because the Stark splitting once established has a certain latency and persistence the desired asymmetrical shape may be created by rapidly steering the laser beam or the energy beam to trace out the shape, as discussed further below. In yet another aspect, the desired asymmetrical shape may be created by passing an energy beam through a mask with the desired shape. And as mentioned above, a permanent or semi-permanent shape may be established by physical, electrical, or magnetic inclusions in the material. Other techniques for shaping the dead region may also be used.

Thus, an RF signal may be radiated from a desired location on the photoconversion material 110 by directing a laser or other energy beam source at the desired location and modulating the output of the laser at the desired RF frequency. This concept may be extended to radiate any number of RF signals from any number of locations on the photoconversion material. For example, multiple lasers may be directed to different locations on the photoconversion material to radiate RF signals from the different locations on the photoconversion material. In another example, a laser beam may be split into multiple beams by a beam splitter and the multiple beams may be directed to different locations on the photoconversion material (e.g., using steerable mirrors) to radiate RF signals from the different locations on the photoconversion material.

Thus, various embodiments of the present invention may be used to create an array of RF transmitters on the photoconversion material. An advantage of such an array is that the positions and number of RF transmitters on the photoconversion material may be programmed and/or changed on the fly without the need for wires to carry power or signals to the RF transmitters. Such an array can also be rapidly adjusted to whatever shape, form or size optimizes the intended functional and frequency requirements.

Figure 5:
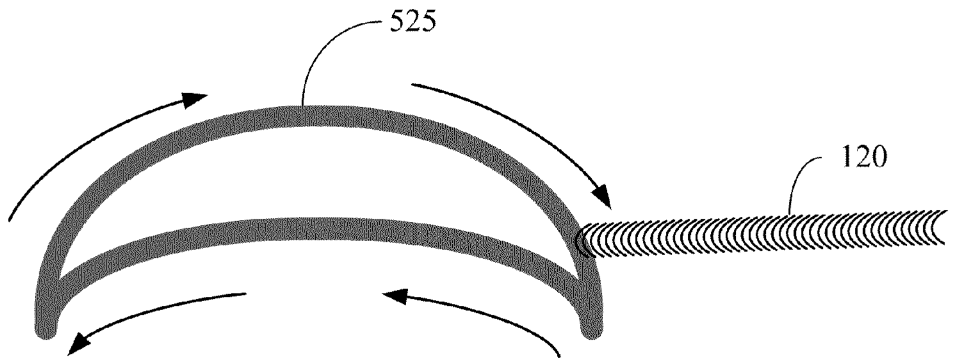
FIG. 5 shows an example of tracing a dead region on the photoconversion material by rapidly steering a laser beam according to an aspect of the subject technology.

As discussed above, the laser beam or other energy beam may be rapidly steered to trace a desired shape for the dead region. For example, FIG. 5 shows the laser beam 120 that is rapidly steered in the direction indicated by the arrows to trace an asymmetrical dead region 525. In this example, the dead region 525 is hollow. An advantage of making the dead region 525 hollow is that it reduces the amount of energy required to form the dead region 525 since energy is only required to trace the boundary of the dead region 525. The dead region 525 can be made hollow because the dead region only needs a boundary in the desired shape to effectively block current and cause the current to flow around the dead region 525.

In one aspect, the laser beam 120 may be rapidly steered to continuously trace the boundary of the dead region 525 as long as the dead region 525 is desired. In this aspect, the laser beam 120 may trace the dead region at a fast enough rate so that the photoconversion material within the dead region does not have time to relax back to its conductive state. In other words, the laser beam 120 may trace the dead region at a fast enough rate so that the laser beam 120 returns to a particular spot on the dead region to reenergize that spot on the dead region before it has time to relax back to a conductive state.

Figure 6:
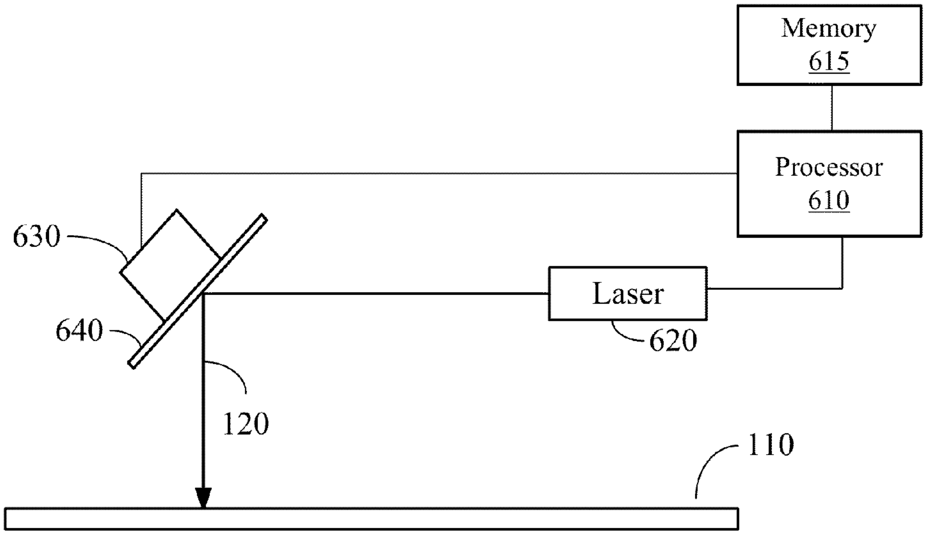
FIG. 6 shows an exemplary system for tracing a dead region on the photoconversion material according to an aspect of the subject technology.

FIG. 6 shows a conceptual block diagram of a system that may be used to trace a desired dead region on the photoconversion material 110 according to one embodiment. The system may comprise a processor 610, a laser 620, a steerable mirror 640 and a mirror actuator 630 for steering the mirror 640, and hence the laser beam 120. The laser 620 outputs the laser beam 120, which is steered by the mirror 640 onto the photoconversion material 110. The processor 610 may control the mirror actuator 630 to steer the laser beam 120 such that the laser beam 120 traces a desired shape for the dead region at a desired location on the photoconversion material. In one aspect, the processor 610 may receive a desired shape and location for the dead region, and control the mirror actuator 630 accordingly so that the laser beam 120 traces the desired shape at the desired location on the photoconversion material. The processor may retrieve the desired shape and location from memory 615 and/or from a command sent to the processor 610. The processor 610 may also control the frequency of the laser beam 610 outputted by the laser 620 according to a desired RF frequency for the RF signal radiated from the photoconversion material.

Instead of using a mirror to steer the laser beam 120, an actuator may be coupled to the laser 620 to steer the laser 620 directly. In this aspect, the processor 610 may controllable steer the laser 610 so that the laser beam 120 traces a desired shape for the dead region at a desired location on the photoconversion material. In another aspect, a combination of a steerable mirror and a steerable laser may be used to steer the laser beam 120.

The processor 610 may perform the various functions described herein by executing instructions stored in memory 615, which may include memory internal to the processor (e.g., cache memory) and/or memory external to the processor (e.g., DRAM, hard drive, etc.). The processor may include a microcontroller, a Digital Signal Processor (DSP), an Application Specific Integrated Circuit (ASIC), a Field Programmable Gate Array (FPGA), hard-wired logic, analog circuitry and/or any combination thereof.

Figure 7A:
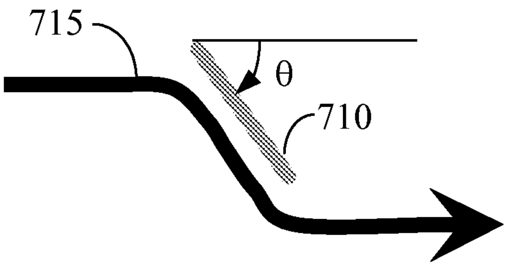
FIG. 7A shows an example of a resistor-equivalent drawn on the photoconversion material according to an aspect of the subject technology.
Figure 7B:
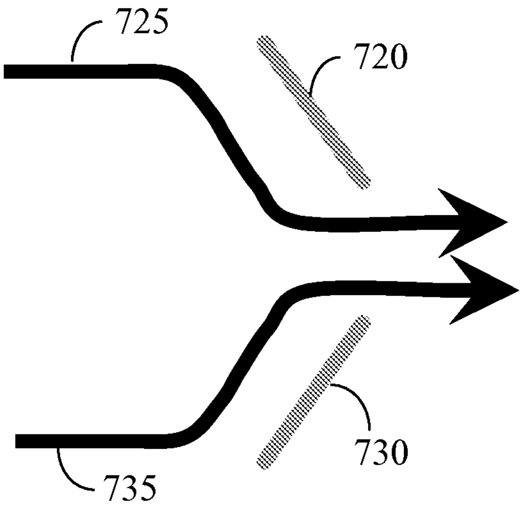
FIG. 7B shows an example of a step-up transformer drawn on the photoconversion material according to an aspect of the subject technology.
Figure 7C:
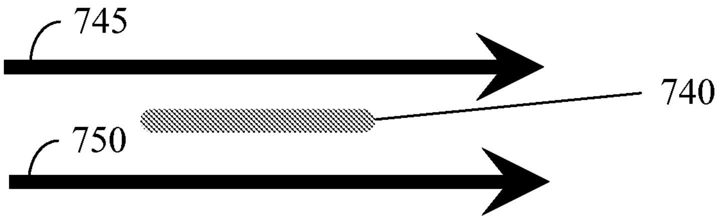
FIG. 7C shows an example of an inductor drawn on the photoconversion material according to an aspect of the subject technology.

In one aspect, one or more dead regions may be created on the photoconversion material 110 using the laser to construct circuit elements on the photoconversion material 110. In effect, various lumped circuit elements can be drawn on the photoconversion material 110 using the laser beam 120 or other energy beam. Various examples of circuit elements that can be drawn on the photoconversion material are shown in FIGS. 7A-7C and discussed below. In each of the examples, the direction of the current flow is from left to right.

FIG. 7A shows an example of an elongated dead region 710 that may be traced on the photoconversion material 110 to construct a resistor. In this example, the dead region 710 is transverse to the current flow 715 at an acute angle θ. Since the current must flow around the dead region 710, this increases the path and reduces the potential field, thereby increasing the resistance and forming a resistance. The resistance of the resistor may be adjusted by adjusting the angle θ of the dead region that is traverse to the current flow. For example, the resistance may be increase by increasing the angle θ. As with all real lumped circuit components these laser drawn components will exhibit some capacitance and inductance as well as some resistance and may be associated with some acceleration leading to radiation losses and noise generation, but these can be small for an optimized geometry.

FIG. 7B shows an example of two elongated dead regions 720 and 730 that may be traced on the photoconversion material 110 to construct a step-up transformer. In this example, the two dead regions 720 and 730 are traced to form a nozzle throat that constricts the current flow 725 and 735 to a narrow opening. Conservation of energy requires that the drift velocity of electrons in the nozzle be faster than the electrons outside of the nozzle. Since drift velocity is the product of a constant and field strength, the field strength must increase, resulting in a step-up transformer. Again other effects will generate some loss, noise, and other electrical properties in addition to the voltage gain.

FIG. 7C shows an example of an elongated dead region 740 that may be traced on the photoconversion material 110 to construct an inductor. In this example, the two current flows 745 and 750 are inductively coupled by the dead region 740, which forms an inductor. As shown in the example in FIG. 7C, the elongated dead region 740 may be parallel to the incoming current flow. Again, there will be some losses that can and must be minimized in an optimized design. Other circuit elements may also be drawn on the photoconversion material including capacitors, switches, etc. The one or more dead regions used to implement a circuit element may be solid or hollow.

Thus, circuit elements can be temporarily drawn on the photoconversion material 110 by tracing dead regions on the photoconversion material 110 to construct the circuit elements. The ability to draw circuit elements on the photoconversion material 110 allows the creation of entire circuits incorporating complex functionality such as A-to-D, heterodyning, mixing, adding, filtering, etc. without the need to add physical components on the surface of the photoconversion material 110. If physical elements are added to the surface, however, even more flexibility of design is afforded. Moreover, except for permanent inclusions and surface elements, these circuits are temporary and only exist as long as the laser beam or other energy beam traces the corresponding dead regions on the photoconversion material 110. This allows a circuit to be quickly replaced with a new circuit drawn a moment later with new functionality, the same functionality at a different frequency, etc. For the embodiment in which an antenna array is formed on the photoconversion material 110, electronics for the antenna array may be drawn right on the photoconversion material 110. The photoconversion 110 may be electrically coupled to an external circuit to connect the external circuit with circuit elements drawn on the photoconversion material 110.

The description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method for transmitting a radio frequency (RF) signal, comprising:

exposing a photoconversion material to a radiant energy source to produce current flow in the photoconversion material; and directing an energy beam to a desired location on the photoconversion material to form an asymmetrical dead region when projected onto the photoconversion material, wherein the asymmetrical dead region causes an RF pulse or signal to be radiated from the photoconversion material, wherein the asymmetrical dead region has first and second sides, the first side having a higher radius of curvature than the second side.

2. The method of claim 1, wherein the energy beam has an energy density that is at least 10 times greater than an energy density of the energy source.

3. The method of claim 2, wherein the energy beam comprises a laser beam.

4. The method of claim 3, further comprising rapidly steering the laser beam to trace the asymmetrical dead region on the photoconversion material.

5. The method of claim 1, wherein the asymmetrical dead region is hollow.

6. An apparatus for transmitting a radio frequency (RF) signal, comprising:

a photoconversion material;

an energy beam generator configured to output an energy beam; and a steering mechanism configured to direct the energy beam to a desired location on the photoconversion material to form an asymmetrical dead region on the photoconversion material when the photoconversion material is exposed to an energy source, wherein the asymmetrical dead region causes the RF signal to be radiated from the photoconversion material.

wherein the asymmetrical dead region has first and second sides, the first side having a higher radius of curvature than the second side.

7. The apparatus of claim 6, wherein the energy beam has an energy density that is at least 10 times greater than an energy density of the energy source.

8. The apparatus of claim 7, wherein the energy beam generator comprises a laser and the energy beam comprises a laser beam.

9. The apparatus of claim 8, wherein the steering mechanism is configured to rapidly steer the laser beam to trace the asymmetrical dead region on the photoconversion material.

10. The apparatus of claim 6, wherein the asymmetrical dead region is hollow.

11. A method for drawing a circuit element, comprising:

exposing a photoconversion material to an energy source to produce current flow in the photoconversion material; and directing an energy beam to a desired location on the photoconversion material to form one or more dead regions on the photoconversion material, wherein the formed one or more dead regions implement the circuit element on the photoconversion material.

12. The method of claim 11, wherein the circuit element is selected from the group consisting of a resistor, a step-up transformer and an inductor.

13. The method of claim 11, wherein the energy beam has an energy density that is at least 10 times greater than an energy density of the energy source.

14. The method of claim 13, wherein the energy beam comprises a laser beam.

15. The method of claim 14, further comprising rapidly steering the laser beam to trace the one or more dead regions on the photoconversion material.

16. An apparatus for drawing a circuit element, comprising:

a photoconversion material;

an energy beam generator configured to output an energy beam; and a steering mechanism configured to direct the energy beam to a desired location on the photoconversion material to form one or more dead regions on the photoconversion material when the photoconversion material is exposed to an energy source, wherein the formed one or more dead regions implement the circuit element on the photoconversion material.

17. The apparatus of claim 16, wherein the circuit element is selected from the group consisting of a resistor, a step-up transformer and an inductor.

18. The apparatus of claim 16, wherein the energy beam has an energy density that is at least 10 times greater than an energy density of the energy source.

19. The apparatus of claim 18, wherein the energy beam generator comprises a laser and the energy beam comprises a laser beam.

20. The apparatus of claim 19, wherein the steering mechanism is configured to rapidly steer the laser beam to trace the one or more dead regions on the photoconversion material.

* * * * *